United States Patent [19]

Pruehs et al.

[11] Patent Number: 5,361,026
[45] Date of Patent: Nov. 1, 1994

[54] LOAD INDICATING SOCKET TESTER

[75] Inventors: Allen V. Pruehs, Howell; Darrell A. Robinson, Highland, both of Mich.

[73] Assignee: Ekstrom Industries, Inc., Farmington Hills, Mich.

[21] Appl. No.: 939,611

[22] Filed: Sep. 2, 1992

[51] Int. Cl.[5] .............................................. G01R 1/04
[52] U.S. Cl. ...................................... 324/74; 324/556; 324/133
[58] Field of Search .................. 324/556, 133, 51, 66; 340/635, 637, 641, 642, 652, 56

[56] References Cited

U.S. PATENT DOCUMENTS 3,579,100  5/1971  Lauver ................................. 324/66

OTHER PUBLICATIONS

"Ekstrom Single Phase Meter Socket Tester Type S-120", Bulletin 9928, May 1, 1980, Revised Jun. 1985.

*Primary Examiner*—Walter E. Snow
*Assistant Examiner*—Barry C. Bowser
*Attorney, Agent, or Firm*—Basile and Hanlon

[57] ABSTRACT

A load indicating socket tester includes a base and an annular sidewall. A plurality of pairs of line and load terminals are mounted in and extend outward from the base for removable insertion into electrical contact with jaw terminals in a watthour meter socket. A cover closes an open end of the side wall of the housing and has fuses, lamps, an amp meter, and a lamp test switch mounted thereon. The fuses and lamps are preferably provided in pairs and electrically connected with the lamp test switch such that the switch, when in a first position, connects each lamp in parallel with one of the fuses and, when in a second position, electrically connects each lamp in series with one of the fuses to test the operation of each lamp. A current transformer is mounted within the housing and detects the current drawn by a load when the socket tester is mounted in a watthour meter socket. The output of the current transformer is connected to the amp meter to enable the load current to be visibly displayed externally of the cover of the socket tester.

18 Claims, 3 Drawing Sheets

LOAD INDICATING SOCKET TESTER

BACKGROUND OF THE INVENTION

1. Field of the Invention

The present invention relates, in general, to electric watthour meters and, more specifically, to test devices for installing watthour meters.

2. Description of the Art

Electric watthour meters are commonly used to measure electric power consumption at a building, home or other site. Typically, a meter socket is attached to an exterior wall surface of the building or home. The socket includes, for single phase electrical service, a pair of line terminals and a corresponding pair of load terminals. The incoming electrical power conductors are connected to the line terminals. The building electrical wiring circuits are connected to the load terminals, typically through an intermediate service panel mounted within the building or home which contains at least one main circuit breaker and a number of individual circuit breakers or fuses for each electrical circuit.

In a conventional socket-type meter application, the meter socket includes jaw-type line and load terminals which receive corresponding blade terminals extending outward from the base of a watthour meter in a push-in connection.

However, it is potentially dangerous for a watthour meter installer to mount the watthour meter in a socket if the watthour meter socket is not properly wired, or if a short circuit, improper ground or a backfeed condition exists. As a result, a single-phase meter socket tester, type S-120, was devised by Ekstrom Industries, Inc., Farmington Hills, Michigan. This meter socket tester has found widespread application in the electric utility industry.

As shown in FIGS. 1 and 2, the S-120 meter socket tester includes a base having at least four blade-type terminals extending outward therefrom for insertion into the jaw terminals of a meter socket. A clear plastic cover is mounted on the front surface of the base and covers the interior circuitry mounted on the base which includes four blade terminals arranged in spaced pairs as line and load terminals, a pair of fuses, and two pairs of lights, referred to as "safe lights" and "fault lights". A spare set of fuses are also mounted within the cover on the front surface of the base. A handle is attached to the cover and provides an easy means for inserting and removing the meter socket tester to and from a watthour meter socket.

As shown in FIG. 2, the circuitry of the S-120 meter socket tester connects the pair of safe lights in series with accompanying resistors between the load terminals. A fault light is connected in parallel with each fuse between one line terminal and one load terminal.

In use, the installer places the S-120 meter socket tester into the socket such that the bottom two load blade terminals of the tester touch the bottom two jaw or load terminals of the meter socket. If both safe lights glow, indicating a backfeed condition, internal jumpers in the socket, or a reversal of line and load wiring, the installer is made aware that a fault exists and that corrective action is necessary. The installer, assuming that one or both of the safe lights did not glow in the initial step, will then insert all of the terminals of the socket tester into the jaw terminals in the meter socket. If both safe lights glow, there is no fault present and the installer can safely install the watthour meter in the socket. However, if only one safe light or any fault lights glow, the installer must then determine the nature of the fault and correct it, disassemble the handle and cover, refuse the socket tester, reassemble the handle and cover, and repeat the above-described testing procedure. The fault lamps will glow whenever the associated fuse blows. This can occur when the customer's main disconnect switch is closed and a load of more than 30 amps is present. A properly wired meter socket is indicated by both safe lights glowing and no fault light glowing when the socket tester is fully inserted into the meter socket terminals.

While the above-described S-120 meter socket tester has been found to be effective in detecting watthour meter socket wiring errors or fault conditions prior to the insertion of a watthour meter into the socket, the testing procedure using the S-120 meter socket tester is difficult and requires a number of individual steps to determine the nature of the fault. Further, there is no indication that the safe or fault lights are still operative and, if any of such lights are inoperative, the meter socket tester becomes wholly or partially inoperative.

A further problem existing with the use of the above-described S-120 meter socket tester is that the use of the socket tester and the installation of the watthour meter into the meter socket should be done only if the customer's main circuit disconnect switch is open. If this is not done, it is possible to blow the fuses in the socket tester and cause the fault lights to glow indicating an energize load of 30 amps or more. However, it is common for the building to which the meter is to be installed to be locked thereby preventing access to the internal main circuit disconnect switch. Thus, the installer has no means to indicate that a circuit within the building is active when the meter is installed. Depending upon the nature of such circuit, the circuit load could be connected up to 30 amps if the meter is installed. This could result in a dangerous condition if the circuit includes, for example, an electric stove or heater having combustible materials present on or in proximity to the burners thereof.

Thus, it would be desirable to provide an improved watthour socket tester which overcomes the problems of previously devised watthour socket testers. It would also be desirable to provide a watthour meter socket tester which easily and safely determines the wiring connections of a meter socket prior to the installation of a watthour meter therein. It would also be desirable to provide a watthour meter socket tester which provides an indication of any load current prior to the installation of the watthour meter. It would be desirable to provide a watthour meter socket tester which includes means for testing the fault lamps for proper operation. Finally, it would be desirable to provide a watthour meter socket tester which provides access to the fuses without removing the handle and cover from the tester or exposing the installer to the energized circuit in the tester.

SUMMARY OF THE INVENTION

The present invention is an electric watthour meter socket tester which tests the wiring of a watthour meter socket prior to the installation of a watthour meter therein. The socket tester includes a housing having a base, an annular side wall extending from and connected to the base and surrounding an interior cavity adjacent to one surface of the base, and a cover spaced from the base and mounted to an open end of the side wall to close the interior cavity in the housing. First and second pairs of terminals are mounted in and extend outward from the base for releasable insertion into the line and load jaws or terminals in a watthour meter socket.

A pair of lamps are mounted on the cover, with each lamp being electrically connected to one of a pair of line terminals in the base and through a switch means to one of the load terminals. A pair of fuses are also mounted in the cover, with each fuse being electrically connected to one of the pair of line terminals and one of the pair of load terminals. The switch means includes a manually operated switch mounted on the cover and switchable between two positions. The switch controls a pair of electrical contacts which are switchable between a first electrically conductive position connecting each lamp in parallel with one of the fuses and a second electrically conductive position connecting each lamp in series with one of the fuses.

In a preferred embodiment, an amp meter is also mounted on the cover and connected to a current transformer mounted within the housing and coupled to the load circuit via the load terminals when the socket tester is mounted in the watthour meter socket. The amp meter displays the magnitude of current drawn by a load through the pair of load terminals when the socket tester is mounted in the meter socket. In this manner, any active load circuits within the building can be detected by the watthour meter installer, prior to the installation of the watthour meter in the meter socket. The socket tester includes electrical conductors extending between each load terminal and a corresponding line terminal to provide an indication of the total current drawn by the load through each phase of electrical service. Alternately, separate current transformers may be provided for each phase.

In another embodiment, a clipping means is connected across the lead connections of the amp meter for limiting the current applied to the meter to a predetermined amount.

The fuses are removably mounted in fuse holders mounted on the cover thereby enabling the fuses to be accessed externally from the socket tester housing. This simplifies the replacement of the fuses, when necessary. Spare fuses are mounted in fuse holders attached to the exterior surface of the side wall of the housing for use when necessary.

The meter socket tester of the present invention overcomes many of the problems encountered with previously devised watthour meter socket testers. The socket tester is simple to use and quickly and easily provides an indication of a wiring fault, short circuit, ground or backfeed condition in the meter socket. More importantly, the manually operated switch provides an easy means for indicating that the lamps mounted in the socket tester are still operable thereby insuring that the socket tester is in proper operating condition. The use of an amp meter on the socket tester provides additional safety feature in that any active load circuits in the building will be detected and the amount of current drawn thereby displayed on the amp meter prior to the installation of the watthour meter in the socket. This avoids a potentially dangerous situation since the meter installer frequently does not have access to the main circuit disconnect switch within the building when installing the meter. The present meter socket tester also provides fuses which are accessible through the cover and exteriorly from the interior of the housing. This simplifies the use of the tester in that the installer can easily replace any blown fuses without removing the handle and cover from the housing as in previously devised watthour meter socket testers. Further, the exteriorly accessible fuses enables the installer to replace blown fuses without being exposed to the energized circuit within the socket tester if the socket tester is left installed in a watthour meter socket.

BRIEF DESCRIPTION OF THE DRAWING

The various features, advantages and other uses of the present invention will become more apparent by referring to the following detailed description and drawing in which.

DESCRIPTION OF THE PREFERRED EMBODIMENTS

Figure 1:
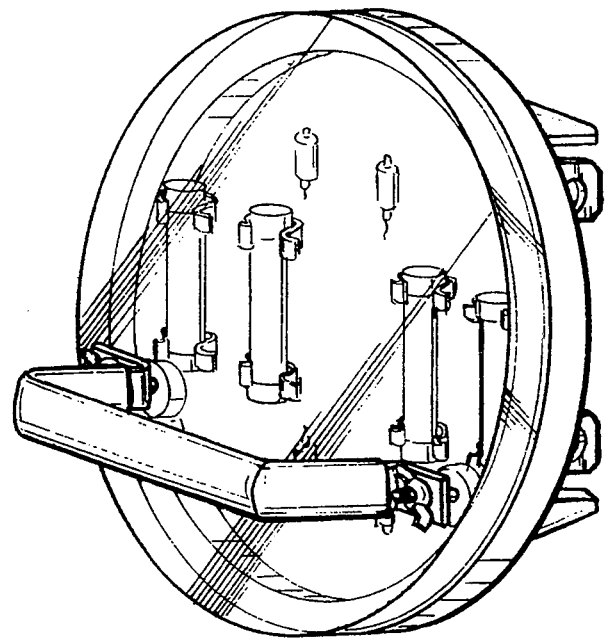
FIG. 1 is a perspective view of a prior art watthour meter socket tester.
Figure 2:
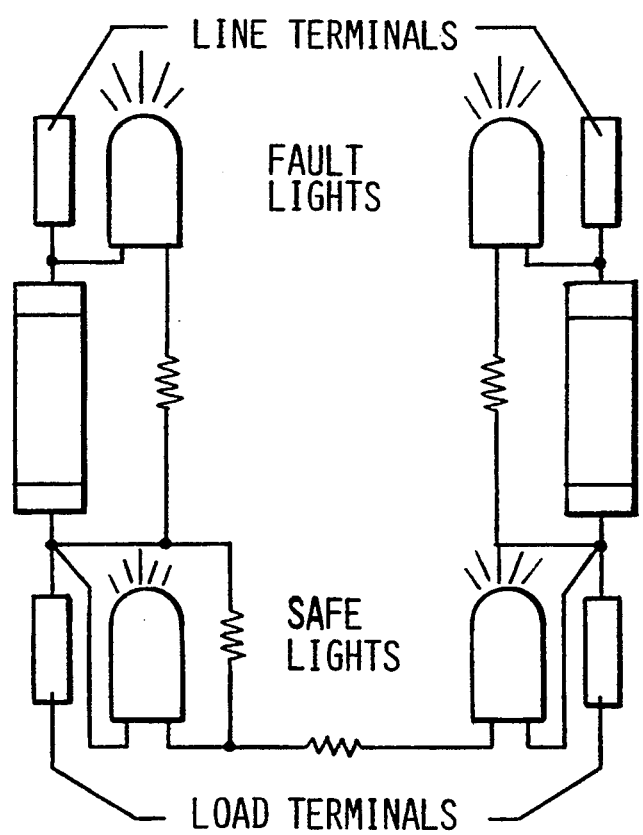
FIG. 2 is a circuit diagram of the prior art watthour meter socket tester shown in FIG. 1.
Figure 3:
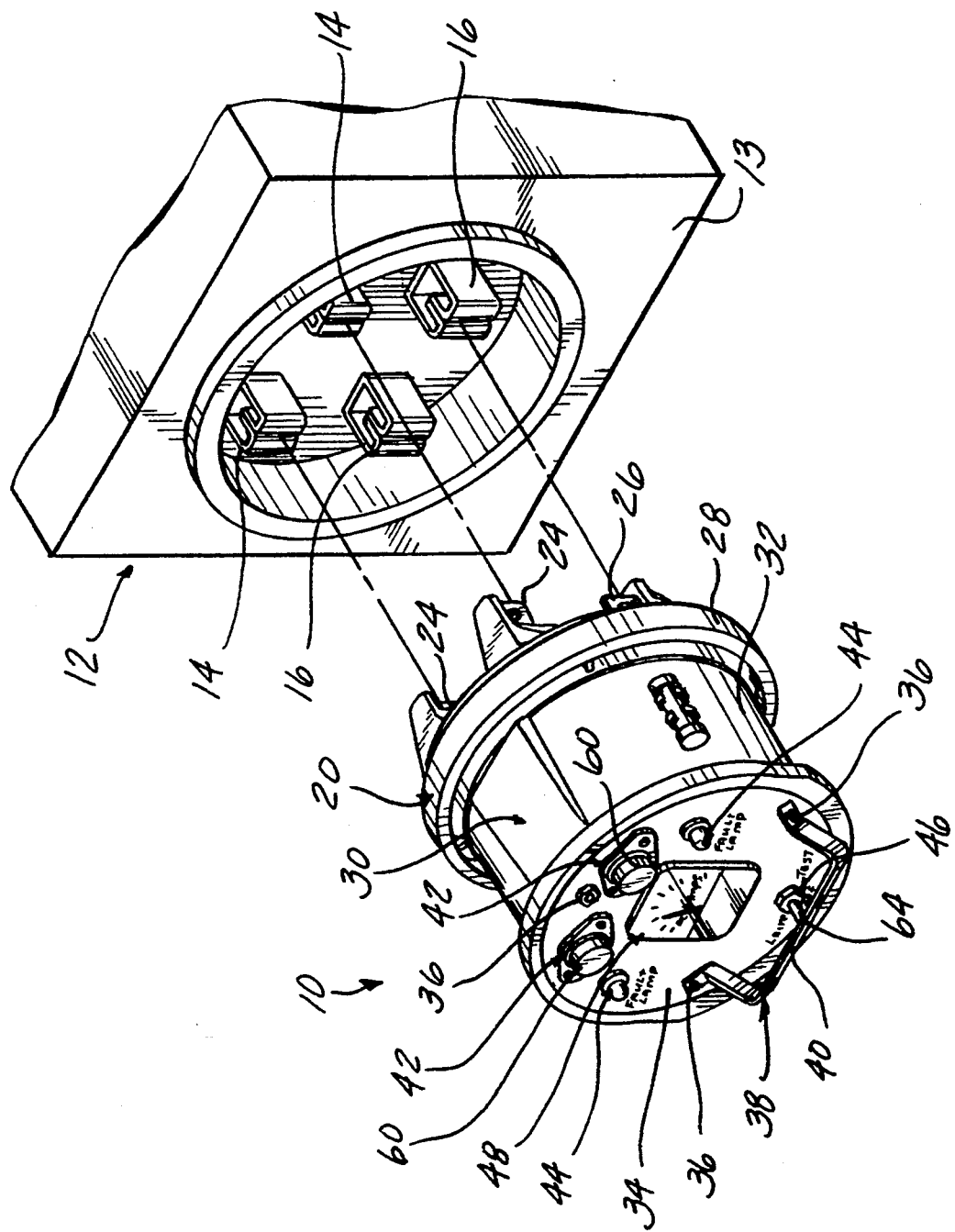
FIG. 3 is an exploded, perspective view showing the mounting of a watthour meter socket tester according to the present invention in a watthour meter socket.
Figure 4:
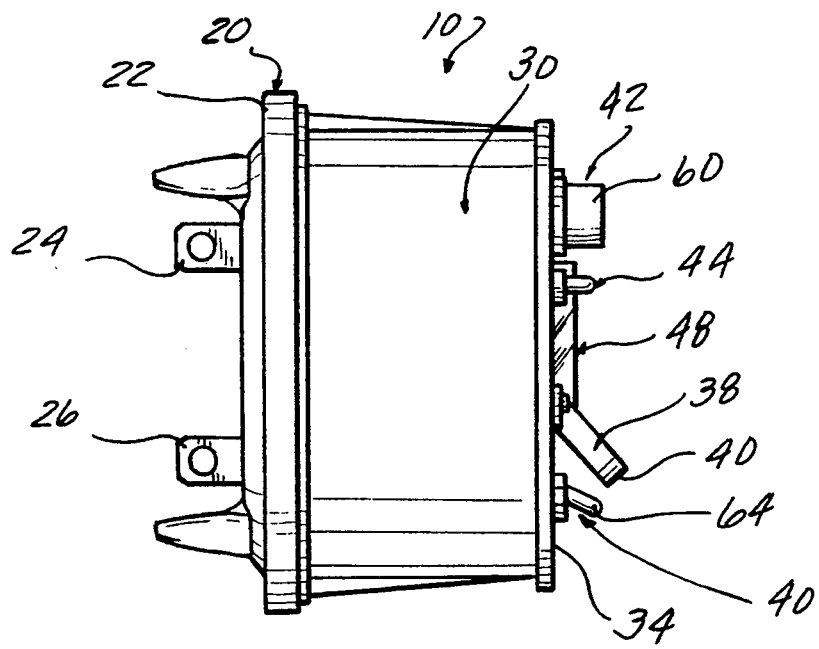
FIG. 4 is a side elevational view of the watthour meter socket tester shown in FIG. 3.
Figure 5:
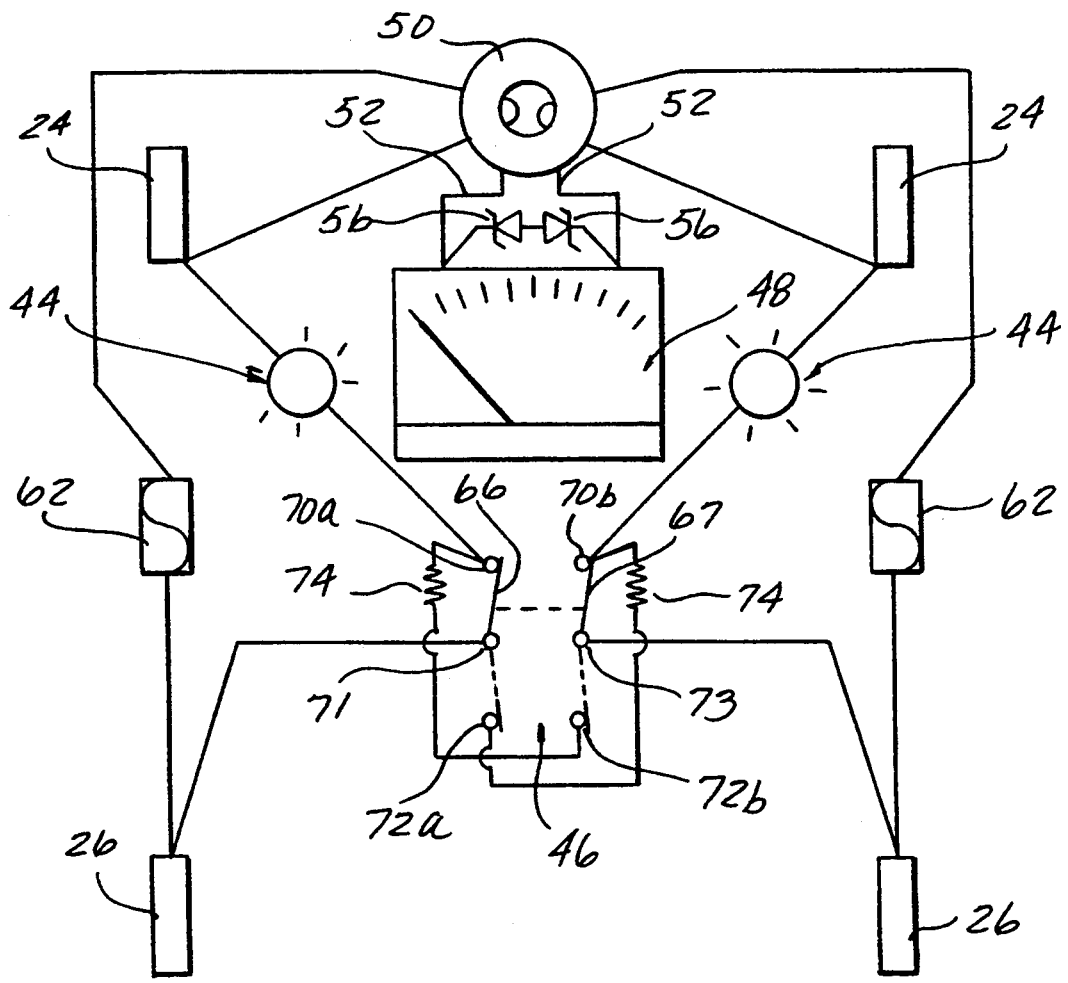
FIG. 5 is a circuit diagram of the watthour meter socket tester shown in FIG. 3.

Referring now to the drawing, and to FIGS. 3-5 in particular, there is illustrated a watthour meter socket tester 10 constructed according to the present invention to test the wiring of a watthour meter socket prior the installation of an electric watthour meter into the meter socket 12.

By way of background only, the watthour meter socket 12 is usually mounted on an exterior wall surface of a building, home, etc. Electrical power line conductors, not shown, extend from the electric utility service to the socket 12 and are connected, in a single-phase application, to a pair of line terminals or jaws denoted by reference number 14 mounted within the interior of a housing 13 of the socket 12. Similarly, load conductors, also not shown, are connected to a pair of load terminals or jaws 16 also mounted within the housing 13 of the socket 12 and to the interior building service panel from which a plurality of individual electrical circuits extend.

The meter socket tester 10 of the present invention includes a generally planar, annular base 20 having a plurality of blade-type terminals mounted therein, with a portion of each terminal extending outward from a back surface 22 of the base 20. For a single-phase, two-line 120/240 V three-wire electrical service, the terminals are arranged in a pair of line terminals 24 and a pair of load terminals 26. The line terminals 24 and the load terminals 26 on the meter socket tester 10 are designed to releasably engage the corresponding jaw terminals 14 and 16, respectively, in the housing 13 of the watthour meter socket 12.

A mounting flange 28 extends peripherally around the base 20 for engagement with the exterior surface of the housing 13.

The meter socket tester 10 also includes a shell 30 which may be a separate member fixedly connected to the base 20 or integrally joined as a single-piece unit with the base 20. The shell 30 includes an annular side wall 32 which surrounds a hollow internal cavity, not shown. An outer end of the shell 30 spaced from the base 20 is open. The open end is closed by a cover 34 which is connected to the base 20 by means of fasteners 36 which extend through the cover 34 into engagement with mating fastener portions mounted on the base 20.

A handle 38 is attached to the cover 34 by certain of the fasteners 36. The handle 38 includes a central grip portion 40 which is spaced from the cover 34 to provide an easy gripping surface for inserting and removing the socket tester 10 into and out of the watthour meter socket 12, as described hereafter. The grip portion 40, as shown in FIG. 3 and 4, is disposed at an acute angle with respect to the bottom portion of the cover 34. This angled configuration for the grip portion 40 of the handle 38 provides protection for the operative components mounted on the cover 34, as described hereafter.

Also mounted on the cover 34 are two fuse means 42, a pair of fault lamps 44, a manually operable switch means 46 and an AC ampere meter 48. Each of these elements will now be described with respect to its mounting on the cover 34 as well as its circuit connections as shown in FIG. 5.

As shown in FIG. 5, a current transformer 50 having a winding ratio of 1000:1 is mounted internally within the interior cavity surrounded by the shell 30. Electrical conductors connected to and between the line and load terminals 24 and 26, as described hereafter, are wound through the current transformer 50 and induce a current therein in proportion to the amount of current drawn by a load when the socket tester 10 is inserted into the watthour meter socket 12. A pair of leads 52 are connected between the current transformer 50 and the amp meter 48 for providing a proportional current to the amp meter 48 which is displayed on the face of the amp meter 48 and which indicates the amount of current drawn by an active load connected to the jaws 14 and 16 in the watthour meter socket 12.

The AC amp meter 48 may be an analog amp meter, as shown in FIGS. 3 and 5, or a digital meter. The amp meter 48 has the capability of displaying any predetermined maximum current, such as currents greater than 25 amps.

A clipping means denoted in general by reference number 54 is connected between the leads 52 for clipping or limiting the amount of current input to the amp meter 48 to a predetermined maximum amount. The clipping means 54 preferably comprises a pair of reverse connected zener diodes 56 which have a predetermined maximum voltage rating and which conduct when the current through the leads 52 generates a voltage which equals or exceeds the voltage rating thereby shunting such overcurrent.

The fuse means 42, as shown in FIGS. 3 and 4, includes a suitable fuse holder mounted on the cover 34 and having a removable cap 60. A suitable fuse clip, not shown, is mounted within the fuse holder 42 for removably receiving a conventional fuse denoted by reference number 62 in FIG. 5. The fuses 62 may have any predetermined rating, such as 30 amps, by way of example only. One fuse 62 is connected between one line terminal 24 and one load terminal 26. The other fuse 62 is similarly connected between the other line terminal 24 and load terminal 26 in the meter socket tester 10. As shown in FIG. 5, the electrical conductor extending between each fuse 62 and the corresponding load terminal 26 is wound around the current transformer 50 to generate an induced current in the current transformer 50 in proportion to the single-phase current drawn through each pair of line and load terminals 24 and 26.

Each single-phase current is combined by the current transformer 50 and displayed as a total current by the amp meter 48.

The switch means 46 which serves as a lamp test switch includes a manually movable switch operator 64 mounted externally on the cover 34 and manually movable between two distinct positions. Preferably, the operator 64 is biased to normally return to one position when released. The switch operator 64 is coupled to a pair of switchable contacts 66 and 67 shown in FIG. 5 which switch positions, depending upon the position of the switch operator 64, from a first electrically conductive position between a first pair of electrical contact terminals 70a, 71 and 70b, 73 and a second electrically conductive position connected across a second pair of electrical contact terminals 71, 72a and 73, 72b. As shown in FIG. 5, one terminal of each of the first and second pair of terminals, denoted by reference numbers 71 and 73, is common to both pairs of electrical contact terminals.

As shown in FIG. 5, each lamp 44 is connected between a line terminal 24 and one of the contact terminals 70a and 70b of the switch means 46 which corresponds to the first electrically conductive position of the contacts 66 and 67. The first electrical contact 66 bridges the first pair of electrical contact terminals 70a and 71 when in the first electrically conductive position thereby electrically connecting one of the lamps 44 between one pair of line and load terminals 24 and 26, respectively, and in parallel with one of the fuses 62. The second electrical contact 67, when in the first conductive position shown in solid in FIG. 5, bridges the contact terminals 70b and 71 of the second pair of electrical contact terminals, thereby connecting the other lamp 44 between the other line and load terminals 24 and 26 and in parallel with the other fuse 62.

The switch means 46 by means of the switchable contacts 66 and 67 is designed to switchably connect the lamps 44 in a first circuit configuration in which each lamp 44 is connected in parallel with one of the fuses 62 and a second circuit configuration in which each lamp 44 is connected across a line terminal 24 and a load terminal 26.

In the parallel circuit connection described above, as shown in solid in FIG. 5, each lamp 44 is connected in parallel with an associated fuse 62 and acts as a fuse continuity test indicator. If either fuse 62 is operable or has continuity, the operable fuse 62 will short out the associated lamp 44 and prevent the lamp 44 from glowing. Alternately, if either fuse 62 is blown, the corresponding lamp 44 will glow thereby indicating a blown fuse 62.

When the switch means 46 is switched to the second position in which the switch contacts 66 and 67 extend across the second pair of electrical terminals 71, 72a and 73, 72b, the switch contacts 66 and 67 connect each lamp 44 across a line terminal 24 and a load terminal 26 through a resistor 74 to thereby apply potential to each lamp 44 and to provide an indication of whether each lamp 44 is still in an operable condition. The lack of illumination of either lamp 44 when the switch means 46 is in the second or lamp test position is an indication that the non-illuminated lamp 44 is inoperative and needs to be replaced.

The lamp test circuit described above provides an added safety check for the installer to verify that the non-illumination of either or both lamps 44 when the switch means 46 is in the parallel circuit configuration is due to a blown fuse 62 and not a defective lamp 44.

The operation of the meter socket tester 10 in determining the wiring condition of a watthour meter socket 12 will now be described. In a first step, the installer inserts the socket tester 10 into the watthour meter socket 12 with the two bottom load blade terminals 26 contacting the load jaws 16 in the housing 13 of the watthour meter socket 12. The installer then rocks the socket tester 10 to bring all four blade terminals 24 and 26 into respective contact with the jaws 14 and 16, respectively, in the watthour meter socket 12. If neither of the lamps 44 glow, the installer can then proceed with step 2 as described below. If either or both lamps 44 glow, indicating a blown fuse or fuses 62, the installer will know not to install the watthour meter in the watthour meter socket 12.

In step 2, with all four line and load blade terminals 24 and 26 disposed in contact with the corresponding line and load jaws 14 and 16, the installer activates the lamp test switch 44 by switching the switch operator 64 to its second position. If both lamps 44 glow, thereby indicating proper operation of the lamps 44, the installer can proceed with step 3. If either or both lamps 44 do not glow, the installer is advised not to install the watthour meter in the watthour meter socket 12 until the lamps 44 are checked and replaced if necessary.

In step 3, with all four line and load terminals 24 and 26 contacting the jaws 14 and 16 in the watthour meter socket 12, the installer can check the current reading on the meter 48. The installer should install the watthour meter in the watthour meter socket 12 if and only if the current indicated on amp meter 48 is less than or equal to a predetermined acceptable maximum established by each electric utility. If the indicated current is above the predetermined level, indicative of a high current active load, the watthour meter should not be installed in the watthour meter socket 12.

The above-identified description of a watthour meter socket tester 10 has been for a single-phase, three-wire circuit. It is also possible to modify the socket tester 10 for polyphase operation. In a polyphase application, three lamps 44 and three fuses 62 with associated switch contacts will be interconnected, in a similar manner as that described above.

In summary, there has been described a unique watthour meter socket tester which simplifies the testing of the wiring of a watthour meter socket prior to the installation of a watthour meter in the socket. The tester is simple to use and expedites the socket testing operation. The socket tester of the present invention uniquely provides a lamp test switch which indicates whether or not the lamps are operable so as to insure proper operation of the tester to be determined at any time. Further, the amp meter mounted on the socket tester uniquely provides an indication of the amount of current drawn by an active load connected to the watthour meter socket prior to the installation of the watthour meter in the watthour meter socket. This prevents the occurrence of a dangerous situation where a watthour meter is installed in a watthour meter socket with an active load connected to the socket which may draw current above a predetermined acceptable level.

What is claimed is:

1. In combination with an electrical watthour meter socket having a pair of line jaw terminals normally connected to an external source of electrical power and a pair of load jaw terminals normally connected to a building power distribution circuit, a tester comprising:

a housing having a base, and a cover spaced from one surface of the base and affixed to the base to form an interior cavity between the one surface of the base and the cover;

line and load pairs of terminals mounted in and extending outward from an opposite surface of the base for releasable insertion into electrical contact with the pairs of line and load jaw terminals, respectively, in the watthour meter socket;

a pair of lamps mounted on the cover;

a pair of fuses accessible through the cover, each fuse electrically connected between one line terminal and one load terminal of each pair of line and load terminals in the base; and switch means, mounted on the cover and switchable between two positions, for selectively switching electrical contacts connected thereto between a first electrically conductive position connecting each of the pair of lamps between one of the line terminals and one of the load terminals on the base is parallel with one of the fuses such that the lamps provide an indication of the continuity of the fuses and safe wiring of the watthour meter socket for mounting of a watthour meter therein by non-illumination of the lamps when electric current flows from the external power source connected to the line terminals through the fuses to the load terminals, and a second electrically conductive position connecting each lamp between the respective one of the line terminals and the other of the load terminals in the base to provide an indication of the operability of the lamps and the presence of electrical voltage through illumination of the lamps.

2. The tester of claim 1 further comprising;

an amp meter mounted on the cover for displaying the magnitude of electrical current from the external source of electrical power through the line and load pairs of terminals and the fuses when the tester is mounted in a watthour meter socket.

3. The tester of claim 2 further comprising:

a current transformer mounted within the housing and electrically isolating each of a first pair of a line terminal and a load terminal and a second pair of a line terminal and a load terminal from each other and from the amp meter by magnetically inducing an electrical current to the amp meter in proportion to the sum of the electrical current through each of the fuses connected between the first pair and the second pair of a line terminal and a load terminal; and a pair of leads forming an electrical current loop between the current transformer and the amp meter.

4. The tester of claim 3 further comprising:

clipping means, connected across the leads to the amp meter, for limiting the current applied to the amp meter to a predetermined amount.

5. The tester of claim 4 wherein the clipping means comprises a pair of reverse, series connected zener diodes.

6. The tester of claim 1 further comprising:

a pair of fuse holders mounted in the cover, one fuse being removably mountable in each fuse holder exteriorly of the cover.

7. The tester of claim 1 further comprising:

at least one fuse holder mounted exteriorly on the housing, a spare fuse mounted in the one fuse holder.

8. The tester of claim 1 wherein the switch means comprises:
a switch operator mounted on the cover and switchable between two positions;
the electrical contacts comprising a pair of electrical contacts mounted in the housing and connected to the switch operator, the pair of electrical contacts being movable with the switch operator between first and second positions;
a first pair of electrical contact terminals, each including a pair of terminals mounted in the housing and electrically connected to one lamp and one of the load terminals in the base, respectively, each first pair of electrical contact terminals engaged by the pair of electrical contacts when the electrical contacts are in the first position to respectively connect one lamp between one line terminal and one load terminal on the base in parallel with the fuse connected therebetween; and
a second pair of electrical contact terminals, each including a pair of terminals mounted in the housing and electrically connected to one lamp and one of the load terminals in the base, respectively, each second pair of electrical contact terminals engaged by the pair of electrical contacts when the electrical contacts are in the second position to connect one lamp to an opposite load terminal from the load terminal connected thereto when the electrical contacts are in the first position.

9. In combination with an electrical watthour meter socket having a pair of line jaw terminals normally connected to an external source of electrical power and a pair of load jaw terminals normally connected to a building power distribution circuit, a tester comprising:
a housing having a base, and a cover spaced from one surface of the base and affixed to the base to form an interior cavity between the one surface of the base and the cover;
line and load pairs of terminals mounted in and extending outward from an opposite surface of the base for releasable insertion into electrical contact with the pairs of line and load jaw terminals, respectively, in the watthour meter socket;
a pair of lamps mounted on the cover;
a pair of fuses accessible through the cover, each fuse electrically connected between one line terminal and one load terminal of each pair of line and load terminals in the base; and
switch means, mounted on the cover and switchable between two positions, for selectively switching electrical contacts connected thereto between a first electrically conductive position connecting each of the pair of lamps between one of the line terminals and one of the load terminals on the base in parallel with one of the fuses such that the lamps provide an indication of the continuity of the fuses and safe wiring of the watthour meter socket for mounting of a watthour meter therein by non-illumination of the lamps when electric current flows from the external power source connected to the line terminals through the fuses to the load terminals, and a second electrically conductive position connecting each lamp between the respective one of the line terminals and the other of the load terminals in the base to provide an indication of the operability of the lamps and the presence of electrical voltage through illumination of the lamps;
an amp meter mounted on the cover for displaying the magnitude of electrical current from the external source of electrical power through the line and load pairs of terminals and the fuses when the tester is mounted in a watthour meter socket; and
a pair of fuse holders mounted in the cover, one fuse being removably mountable in each fuse holder and accessible exteriorly of the cover.

10. The tester of claim 9 further comprising:
a current transformer mounted within the housing and electrically isolating each of a first pair of a line terminal and a load terminal and a second pair of a line terminal and a load terminal from each other and from the amp meter by magnetically inducing an electrical current to the amp meter in proportion to the sum of the electrical current through each of the fuses connected between the first pair and the second pair of a line terminal and a load terminal; and
a pair of leads forming an electrical current loop between the current transformer and the amp meter.

11. The tester of claim 10 further comprising:
clipping means, connected across the leads to the amp meter, for limiting the current applied to the amp meter to a predetermined amount.

12. The tester of claim 11 wherein the clipping means comprises a pair of reverse, series connected zener diodes.

13. The tester of claim 9 wherein the switch means comprises:
a switch operator mounted on the cover and switchable between two positions;
the electrical contacts comprising a pair of electrical contacts mounted in the housing and connected to the switch operator, the pair of electrical contacts being movable with the switch operator between first and second positions;
a first pair of electrical contact terminals, each including a pair of terminals mounted in the housing and electrically connected to one lamp and one of the load terminals in the base, respectively, each first pair of electrical contact terminals engaged by the pair of electrical contacts when the electrical contacts are in the first position to respectively connect one lamp between one line terminal and one load terminal on the base in parallel with the fuse connected therebetween; and
a second pair of electrical contact terminals, each including a pair of terminals mounted in the housing and electrically connected to one lamp and one of the load terminals in the base, respectively, each second pair of electrical contact terminals engaged by the pair of electrical contacts when the electrical contacts are in the second position to connect one lamp to an opposite load terminal from the load terminal connected thereto when the electrical contacts are in the first position.

14. The tester of claim 9 further comprising:
at least one fuse holder mounted exteriorly on the housing, a spare fuse mounted in the one fuse holder.

15. In combination with an electrical watthour meter socket having a pair of line jaw terminals normally connected to an external source of electrical power and a pair of load jaw terminals normally connected to a building power distribution circuit, a tester comprising:

a housing having a base, and a cover spaced from one surface of the base and affixed to the base to form an interior cavity between the one surface of the base and the cover;

line and load pairs of terminals mounted in and extending outward from an opposite surface of the base for releasable insertion into electrical contact with the pairs of line and load jaw terminals, respectively, in the watthour meter socket;

a pair of lamps mounted on the cover;

a pair of fuse holders mounted on the cover, a fuse being removably mountable in each fuse holder and accessible exteriorly of the cover, each fuse electrically connected between one line terminal and one load terminal of each pair of line and load terminals in the base;

switch means, mounted on the cover and switchable between two positions, for selectively switching electrical contacts connected thereto between a first electrically conductive position connecting each of the pair of lamps between one of the line terminals and one of the load terminals on the base in parallel with one of the fuses such that the lamps provide an indication of the continuity of the fuses and safe wiring of the watthour meter socket for mounting of a watthour meter therein by non-illumination of the lamps when electric current flows from the external power source connected to the line terminals through the fuses to the load terminals and a second electrically conductive position connecting each lamp between the respective one of the line terminals and the other of the load terminals in the base to provide an indication of the operability of the lamps and the presence of electrical voltage through illumination of the lamps;

an amp meter mounted on the cover for displaying the magnitude of electrical current drawn through the pairs of terminals and the fuses when the tester is mounted in a watthour meter socket;

a current transformer mounted within the housing and electrically isolating each of a first pair of a line terminal and a load terminal and to a second pair of a line terminal and a load terminal from each other and from the amp meter by magnetically inducing an electrical current to the amp meter in proportion to the sum of the electrical current through each of the fuses connected between the first pair and the second pair of a line terminal and a load terminal;

a pair of leads forming an electrical current loop between the current transformer and the amp meter electrical current to the amp meter in proportion to the current drawn between the first and second pairs of terminals;

clipping means, connected across the leads to the amp meter, for limiting the current applied to the amp meter to a predetermined amount; and at least one additional fuse holder mounted exteriorly on the housing, a spare fuse mounted in the one additional fuse holder.

16. An electrical watthour meter socket test apparatus comprising:

a watthour meter socket having a pair of line jaw terminals normally connected to an external source of electrical power and a pair of low jaw terminals normally connected to a building power distribution circuit;

a housing having a base and a cover spaced from one surface of the base and connected to the base to form an interior cavity between the one surface of the base and the cover;

a first load terminal, a second load terminal, a first line terminal, and a second line terminal mounted in and extending outward from an opposite surface of the base for releasable insertion into electrical contact with the pairs of line and load jaw terminals, respectively, in the watthour meter socket;

a pair of lamps mounted on the cover;

a pair of fuses accessible through the cover, one fuse connected between the first line terminal and the first load terminal and the other fuse connected between the second line terminal and the second load terminal to form conductive paths to deliver electrical current from the external power source through the first line terminal to the first load terminal and through the second line terminal to the second load terminal, respectively; and switch means, mounted on the cover and switchable between two positions, for selectively switching electrical contacts connected thereto and mounted on the base between a first electrically conductive position connecting each of the pair of lamps between the first line terminal and the first load terminal and between the second line terminal and the second load terminal, respectively, on the base in parallel with one of the fuses such that the lamps provide an indication of the continuity of the fuses and safe wiring of the watthour meter socket for mounting of a watthour meter therein and a second electrically conductive position connecting one lamp between the first line terminal and the second load terminal and the other lamp between the second line terminal and the first load terminal in the base to provide an indication of the operability of the lamps and the presence of electrical voltage through illumination of the lamps.

17. The electrical watthour meter socket test apparatus of claim 16 further comprising:

an amp meter mounted on the cover for displaying the magnitude of electrical current from the external source of electrical power through the line and load pairs of terminals and the fuses when the tester is mounted in a watthour meter socket.

18. The electrical watthour meter socket test apparatus of claim 16 further comprising:

a pair of fuse holders mounted in the cover, one fuse being removably mountable in each fuse holder exteriorly of the cover.

* * * * *